United States Patent
Cygan et al.

Patent Number: 5,423,082
Date of Patent: Jun. 6, 1995

[54] METHOD FOR A TRANSMITTER TO COMPENSATE FOR VARYING LOADING WITHOUT AN ISOLATOR

[75] Inventors: Lawrence F. Cygan, Schaumburg; Paul H. Gailus, Prospect Heights; William J. Turney, Schaumburg, all of Ill.

[73] Assignee: Motorola, Inc., Schaumburg, Ill.

[21] Appl. No.: 80,635

[22] Filed: Jun. 24, 1993

[51] Int. Cl.⁶ .............. H04B 1/04; H03G 3/20
[52] U.S. Cl. ........................ 455/126; 330/129; 375/295; 455/117
[58] Field of Search ........... 330/129, 279, 298, 207 P; 375/59, 60, 98; 455/115, 117, 126, 127, 89, 90, 102

[56] References Cited
U.S. PATENT DOCUMENTS

| | | | |
|---|---|---|---|
| 4,933,986 | 6/1990 | Leitch | 455/126 |
| 5,038,112 | 8/1991 | O'Neill | 330/298 |
| 5,041,793 | 8/1991 | Gailus | 330/129 |
| 5,066,922 | 11/1991 | Leitch | 455/117 |
| 5,066,923 | 11/1991 | Gailus et al. | 330/129 |
| 5,134,718 | 7/1992 | Gailus | 455/102 |
| 5,175,879 | 12/1992 | Ellingson et al. | 455/127 |
| 5,196,808 | 3/1993 | Pickett et al. | 330/298 |
| 5,278,996 | 1/1994 | Shitora | 455/89 |
| 5,303,394 | 4/1994 | Hrncirik | 455/126 |

Primary Examiner—Edward F. Urban
Assistant Examiner—Lisa Charouel
Attorney, Agent, or Firm—Timothy W. Markison

[57] ABSTRACT

A transmitter that includes an amplifying element, an antenna, a gain stage, and a closed loop feedback may compensate for varying antenna loads without an isolator. This may be accomplished by determining the effects of the varying loading on overall loop gain. Knowing the effects, the transmitter adjusts the gain of the gain stage to maintain a constant overall loop gain, thus eliminating the need for an isolator.

8 Claims, 2 Drawing Sheets

METHOD FOR A TRANSMITTER TO COMPENSATE FOR VARYING LOADING WITHOUT AN ISOLATOR

FIELD OF THE INVENTION

This invention relates generally to radio frequency transmitters and, in particular, to a linear radio frequency transmitter having a varying antenna load.

BACKGROUND OF THE INVENTION

As is known, radio frequency (RF) transmitters modulate baseband signals, such as analog voice or digital voice samples, onto an RF carrier, amplify the RF carrier, and transmit the RF carrier, via an antenna, through the air as electromagnetic energy. The electromagnetic energy is subsequently received by a receiver's antenna, demodulated back to the baseband signal, and rendered audible (if voice was transmitted) by the receiver.

As is also known, many communication systems, such as cellular telephone and trunking, utilize spectrally efficient modulation techniques, such as quadrature amplitude modulation (QAM) and quaternary phase shift keying (QPSK) in a time division multiple access (TDMA) format. These spectrally efficient modulation techniques typically correlate the baseband signal to changes in RF carrier amplitude and phase via a digital symbol constellation format such as the QAM format, which is described in co-pending U.S. patent application Ser. No. 07/783,289, entitled "Communication Signal Having A Time Domain Pilot Component", assigned to Motorola Inc. Since the spectrally efficient modulation techniques require variation of the RF carrier amplitude, a linear class A or class AB amplifier must be used. If the amplifier is not linear, it provides unwanted RF energy, or splatter, at frequencies adjacent to the RF carrier. This splatter may subsequently interfere with two-way communications in process on the adjacent frequencies, or channels.

Linearity of an amplifier is affected by the varying loads presented by the antenna of the transmitter. Typically, an antenna is designed to provide a fixed load, fifty ohms for example. However, due to reflected energy received, the load changes.

To minimize variations in loading, transmitters generally incorporate isolators to provide a substantially constant load impedance to the amplifier. The isolator includes a circulator and a terminating impedance which is typically fifty ohms. The circulator is a three terminal device that provides directional flow of the RF energy from the amplifier to the antenna and from the antenna to the terminating impedance. Therefore, the RF energy sourced by the amplifier is provided to the antenna and any RF energy entering the antenna is absorbed in the terminating impedance. Thus, the isolator presents a constant impedance to the amplifier.

Although the isolator provides a constant load impedance to the RF amplifier, size, cost, and bandwidth limitations typically inhibit the use of a universal isolator in mobile radios, portable radios, and cellular telephones. For example, a radio that operates at 132 MHz requires an isolator that has a volume of 8.19 cubic centimeters (0.5 cubic inches), weighs 227 grams (0.5 pounds), and costs $30 each in quantities of 100,000 per year. As a result, an isolator puts obvious constraints on the design of such radios. Additionally, isolators have fixed bandwidths; therefore, multiple isolators may be required in transmitters which operate over wide frequency ranges. This bandwidth limitation is most noticeable at lower RF carrier frequencies, such as VHF, where the allocated frequency band covers a large percentage bandwidth.

To avoid the use of the isolator, existing frequency modulation (FM) transmitters, which include nonlinear amplifiers, utilize protective feedback circuitry. The protective feedback monitors the voltage standing wave ratio (VSWR) at the nonlinear amplifier's output and correspondingly reduces the amount of output power provided by the nonlinear amplifier to the antenna. This approach generally reduces the nonlinear amplifier's output power by a fixed amount when the VSWR exceeds a predetermined level. For example, when a 3:1 VSWR is detected at the nonlinear amplifier's output, the nonlinear amplifier's output power may be reduced by 3 dB. This approach works for nonlinear amplifiers, but does not include any provisions for maintaining amplifier linearity.

Therefore, a need exists for a method to compensate for effects of varying loading without the need for an isolator in a transmitter that has a linear amplifier.

DESCRIPTION OF THE PREFERRED EMBODIMENT

Generally, the present invention provides a method for a transmitter to compensate for antenna load variations without using of an isolator (circulator plus resistive termination). This is accomplished by determining the effects that the load variations have on the loop gain of the transmitter's feedback loop. Upon determining the effects, the transmitter adjusts either the gain of a variable gain stage within the feedback loop or a signal source level to maintain the transmitter's linearity requirement.

Figure 1:
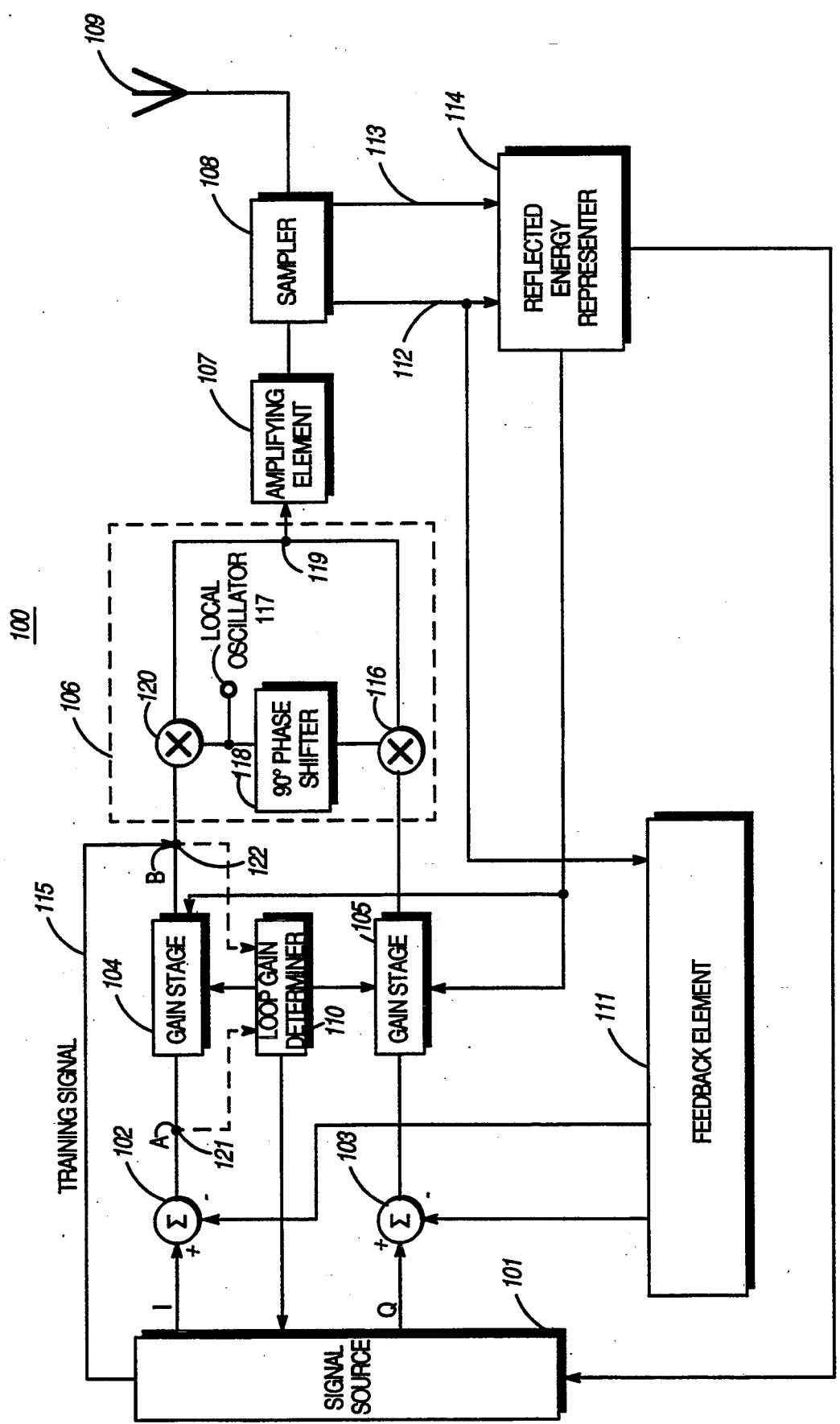
FIG. 1 illustrates a block diagram depiction of a linear transmitter in accordance with the present invention.

The present invention may be more fully described with reference to FIGS. 1 and 2. FIG. 1 illustrates a block diagram of a transmitter 100 that includes a signal source 101, two variable gain stages 104 and 105, a frequency up-converter 106, an amplifying element 107, a sampler 108, an antenna 109, a feedback element 111, and a reflected energy representer 114. In a quadrature amplitude modulation (QAM) scheme, the signal source 101 is typically a digital signal processor (DSP) that generates in-phase (I) and quadrature (Q) signal representations of digital data and processes these I and Q signal representations into baseband analog waveforms. Summing junctions 102 and 103 receive the baseband analog I and Q waveforms, respectively, and subtract them from the baseband outputs of the feedback element 111. The resultant waveforms proceed to their respective gain stages 104 and 105 for amplification and continue to the frequency up-converter 106 for translation to a selected radio frequency (RF) carder. The amplifying element 107 amplifies the RF carrier and submits the amplified RF carrier to the sampler 108 and the antenna 109 for radio transmission.

The sampler 108 samples the amplified RF signal provided by the amplifying element 107 and supplies forward and reflected signal samples 112 and 113 to the reflected energy representer 114 and supplies forward signal samples 112 to the feedback element 111. The feedback element 111, which may include a frequency downconverter, gain stages, and loop phase adjustment circuits, receives the forward signal sample 112, frequency down-converts it by reversing the processing order of the frequency up-converter 106, and produces baseband analog I and Q data representations. These baseband I and Q signals provide the inverting inputs to the summing junctions 102 and 103, thus completing a feedback path. Providing closed loop feedback in such transmitters is known, thus no further discussion will be presented except to facilitate the understanding of this invention. The reflected energy representer 114 accepts the forward and reflected signal samples 112 and 113 to generate representations of the reflected energy based on its input signal samples. As detailed below, the representations of the reflected energy contribute to determining the gains of the two variable gain stages 104 and 105 and the signal levels of the I and Q signal representations generated by the signal source 101.

The functional blocks of the transmitter 100 include a variety of circuit topologies. The gain stages 104 and 105 are typically variable high gain, low frequency amplifiers whose operating bandwidth is restricted to the loop bandwidth required for proper operation of the negative feedback loop, thereby encompassing the bandwidth of the data modulation signals supplied by the signal source 101. The frequency up-converter 106 includes mixers 116 and 120, a local oscillator 117, a 90 degree phase shifter 118, and a signal combinet 119. The frequency translation from baseband to the RF carrier frequency is achieved in the frequency up-converter 106 by mixing the baseband I signal waveform with the local oscillator frequency, mixing the baseband Q signal waveform with a 90 degree phase shifted version of the local oscillator frequency, and summing the two mixer outputs to produce independent I and Q data signals at the common RF carrier frequency. The amplifying element 107 is an RF power amplifier that provides power amplification of the RF carrier frequency, which contains the up-converted data signals, and is commonly formed by cascading several amplifier stages or transistors. Since the envelopes of the analog I and Q waveforms are amplitude dependent, the amplifying element 107 is a linear, class A or class AB, amplifier as opposed to a constant envelope, or class C, nonlinear amplifier. The sampler 108 is preferably a directional coupler that provides scaled representations of forward and reflected voltage, or current, waveforms present at the antenna 109.

The sampler 108, feedback loop element 111, and summing junctions 102 and 103 are configured to enhance the linear amplifying properties of the amplifying element 107. As briefly mentioned above, these elements form a negative feedback system which reduces power levels of unwanted signals which fall outside the assigned frequency band. These unwanted signals result from nonlinearities in the amplifying element 107 and may cause interference in adjacent RF channels, thus disrupting communications on those channels. The unwanted signals in the adjacent RF channels are known as splatter. For a time division multiple access (TDMA) system, the adjacent channel splatter specification may be in the −60 dBc range when comparing the signal powers of the signal in an adjacent channel to the RF carrier signal. This specification is typically achieved by utilizing an amplifying element 107 whose linearity provides adjacent channel splatter performance of −30 dBc and improving the adjacent channel splatter by 30 dB using known Cartesian feedback correction techniques.

Effects of varying loading at the output of the amplifying element 107 due to changes in antenna 109 impedance are determined by either measuring the gain changes of the amplifying element 107, determining representations of the loading via reflected energy received by the antenna 109, or both. To measure the gain variation of the amplifying element 107, a training signal 115, such as a signal discussed in U.S. Pat. No. 5,066,923, entitled "Linear Transmitter Training Method And Apparatus" and assigned to Motorola, is input from the signal source 101 to point B 122 of FIG. 1 when the variable gain stages 104 and 105 are inactivated. Inactivating the variable gain stages 104 and 105 effectively opens the forward path of a feedback loop within the transmitter 100. The training signal 115 is up-converted by the frequency up-converter 106, amplified by the amplifying element 107, and sampled by the sampler 108. The forward sampled signal 112 returns to point A 121 via the feedback element 111 and the summing junction 102, thus completing a transition through the feedback loop. A loop gain determiner 110 is activated during this training sequence to measure the feedback loop's open loop gain by detecting the voltages at points A 121 and B 122 and forming the ratio of the two voltages, i.e. V(A)/V(B). This ratio represents the overall feedback loop gain minus the gain contributions of the inactivated variable gain stages 104 and 105, i.e. the open loop gain. The loop gain determiner 110 includes voltage gain stages, such as operational amplifiers, sample and hold circuitry, analog to digital converters, and a microprocessor.

As briefly mentioned above, the reflected energy representer 114 processes the forward 112 and reflected 113 signal samples to produce representations of the loading presented to the amplifying element 107. The forward signal sample 112 comprises a scaled reproduction of the forward RF carrier energy present at the output of the amplifying element 107. The reflected signal sample 113 comprises a scaled replication of the reflected RF carrier energy received by the antenna 109. As is known, a ratio formed by dividing the magnitude of the reflected signal sample 113 by the magnitude of the forward signal sample 112 is proportional to the magnitude of a load reflection coefficient. This ratio may be computed within the reflected energy representer 114 by independently rectifying and filtering the reflected and forward signal samples 113 and 112 and subsequently determining the ratio of the resulting quantities using voltage gain stages, such as operational amplifiers, sample and hold circuitry, analog to digital converters, and a microprocessor. This ratio provides a scalar representation of the load mismatch provided by the antenna 109 such that a small ratio denotes a minimal mismatch. An alternative method of processing the forward and reflected signal samples 112 and 113 includes forming a direct ratio of the reflected and forward signal samples 112 and 113, thus yielding a vector representation of the load reflection coefficient. The vector representation includes magnitude and phase portions and provides a more detailed electrical description of the load mismatch due to the antenna 109 than does the scalar or magnitude representation; however, it also requires more complex circuitry within the reflected energy representer 114 to compute an accurate ratio.

Upon obtaining the effects of the varying loading, the reflected energy representer 114 or the loop gain determiner 110 may modify the gain of the variable gain stages, via a DC control voltage or a voltage variable attenuator, to substantially maintain the overall feedback loop gain at a predetermined gain level based on the linearity specification of the transmitter 100. Alternatively, the reflected energy representer 114 or the loop gain determiner 110 may instruct the signal source 101 to adjust the levels of the I and Q signals it produces. This adjustment changes the output power level of the amplifying element 107 to accommodate the varying loading while maintaining the linearity specification of the transmitter 100.

Figure 2:
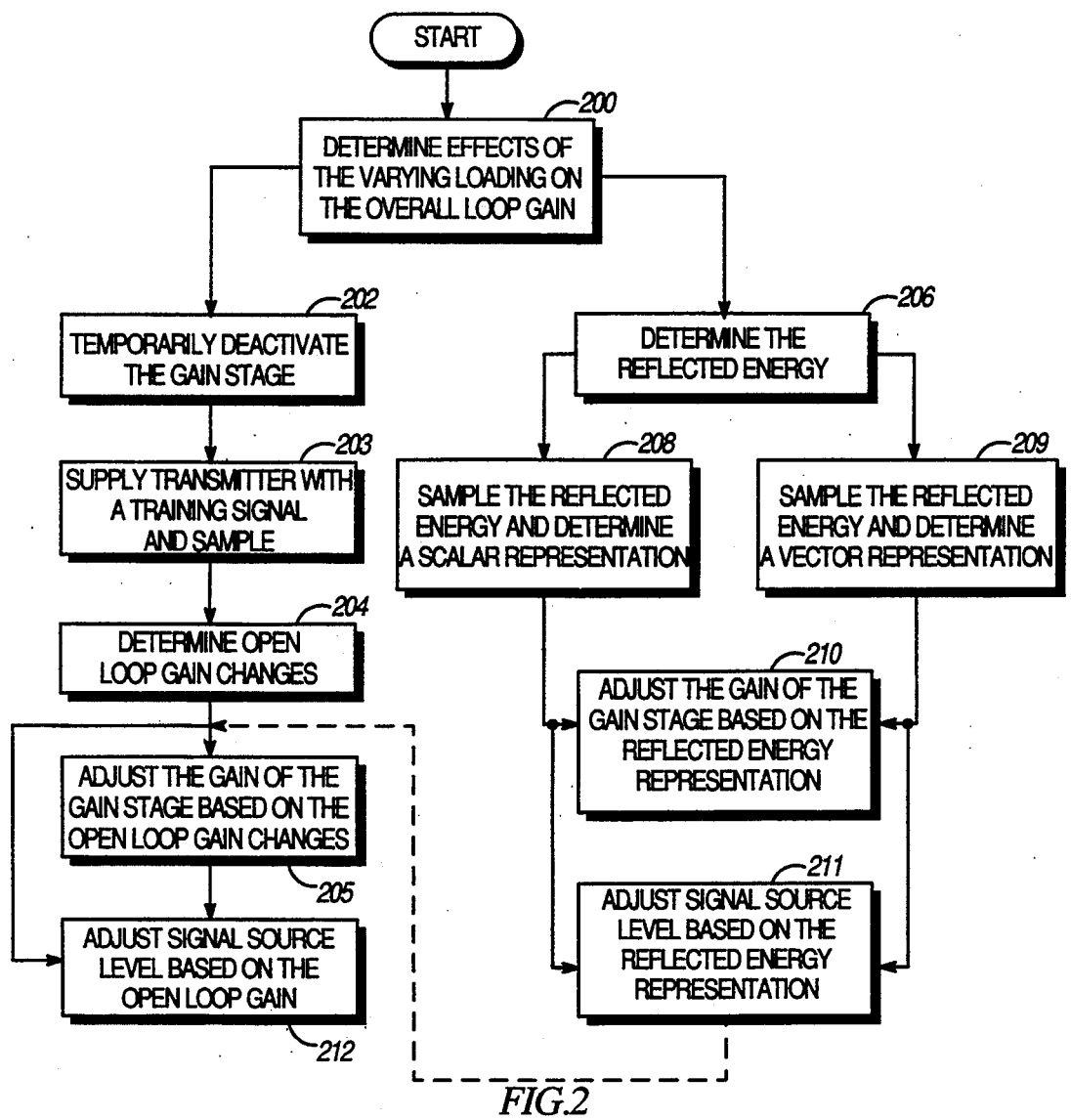
FIG. 2 illustrates a flow diagram of steps executed by a transmitter in accordance with the present invention.

FIG. 2 illustrates a flow diagram of steps that may be executed by the transmitter to implement the present invention. Entering the flow diagram at the START block, logic flow proceeds to block 200 where the transmitter determines effects of the varying loading on the overall loop gain. As discussed above, varying loading at the transmitter's output is a result of the time dependant load impedance presented to the antenna, i.e. receiving reflected signals that are reflected off of buildings, walls, mountains, etc. As the loading at the output of the antenna varies, the gain of the amplifying element varies, which changes the overall gain of the transmitter's feedback loop. To determine the overall loop gain variation and its impact on transmitter performance, the logic flow may proceed on one of two parallel paths depending upon the distribution of possible load impedances and the effect upon power amplifier gain and linearity.

When the range of load impedances, due to reflected energy received by the antenna, does not diverge appreciably from an impedance for which the amplifying element has been designed (i.e. the overall loop gain change is moderate) the path commencing with block 202 is followed. When large load variations are present (i.e. large variations in transmitter gain and linearity) the path initiating with block 206 is followed. Selection of which method to utilize in a transmitter is based on the known environment in which the transmitter will reside. For example, a transmitter operating in an open area, such as the center of a room or the middle of a field, will have slight load variations, thus the path from block 202 will suffice; whereas, a transmitter operating near a highly reflective load, such as a metal wall or building, will have large load variation, thus the path from block 206 would be used.

When the former path is selected, logic flow proceeds to block 202 where the variable gain stages are temporarily deactivated. Deactivation of the variable gain stages is generally accomplished by reducing the gain of each stage to approximately zero through a reduction in the DC supply voltage sourcing each stage's active devices. The deactivation is typically performed at the beginning of each training sequence, which may occur as often as once a time slot in a TDMA communication system (e.g. once every fifteen milliseconds), thus allowing the gain of the variable gain stages to be periodically adjusted in response to the varying loading.

Upon deactivating the variable gain stages, logic flow continues to block 203 where the signal source provides the transmitter with the training signal which is sampled upon exiting the amplifying element. The training signal, which is applied at the beginning of each training sequence, is used to measure and adjust the feedback loop phase parameters and to establish the maximum signal level to which the signal source may drive the power amplifier, or amplifying element. A detailed discussion of the methodology used during the training sequence is provided in the aforementioned U.S. Pat. No. 5,066,923, thus no further discussion will be presented except to facilitate the understanding of the present invention. During the training sequence, the signal source applies the training signal to the output of the I channel's variable gain stage in the absence of I and Q data modulation. The training signal may be used either periodically or on an as needed basis. For example, in a TDMA system that utilizes a three slot time frame, the training signal may be applied during a portion of each time slot when communications are inactive. After the signal source supplies the training signal, it is up-converted to the RF carrier frequency, amplified by the amplifying element, and sampled by a directional coupler, or equivalent sampler. The sampled training signal is down-converted and phase adjusted in the feedback element such that the baseband signal delivered to the I channel's summing junction is properly inverted. The baseband signal proceeds through the summing junction to the input of the I channel's deactivated variable gain stage, thus completing a transition through the complete feedback loop.

Upon arrival of the baseband signal to the input of the I channel's deactivated variable gain stage, the logic flow advances to block 204 where the transmitter determines the open loop gain changes of the feedback loop. The transmitter's loop gain determiner measures the signal voltages provided by the training signal and the baseband feedback signal and forms the ratio of the two signal voltages to produce the open loop voltage gain. The open loop gain represents the overall feedback loop gain less the gain of the deactivated gain stages. Since the power amplifier is included in the feedback loop's forward path, power amplifier gain and linearity changes resulting from transmitter load variations are expressed as changes to the open loop gain.

Once the open loop gain changes are determined and the training sequence concludes, the logic flow proceeds either to block 205, block 212, or both. The logic flow transition to block 205 occurs when loop gain compensation for changes in power amplifier gain is necessary. At block 205, the transmitter adjusts the gain of the I and Q channels' variable gain stages based on the open loop gain changes. The gain of these stages is adjusted in a known manner by varying loop compensation components, such as variable resistors, or via a gain control signal, such as a DC voltage, to maintain a predetermined overall loop gain. The predetermined loop gain may be a constant value for small deviations in overall loop gain or a range of values corresponding to a range of overall loop gain changes. The logic flow transition to block 212 occurs when signal source adjustment is necessary to compensate for changes in power amplifier linearity. At block 212, the transmitter adjusts the signal source levels of the I and Q signals based on the open loop gain changes. The loop gain determiner sends the signal source a scaling command dependant on the extent of the open loop gain changes. The scaling commands indicate the direction and amount of signal source level adjustment. When power amplifier linearity is adversely affected by the transmitter load, lowering the I and Q signal levels assists operation of the negative feedback loop in avoiding adjacent channel splatter. For transmitter loads which offer an improvement in power amplifier linearity, raising the data signal level may be appropriate, thereby taking advantage of a favorable load condition which allows the power output level of the transmitter to be increased. The signal source level and variable gain stage gain adjustments of blocks 212 and 205 may also be performed simultaneously, or sequentially, when loop gain compensation for changes in both power amplifier gain and linearity is necessary.

When the latter of the two path choices available at block 200 is selected., the logic flow proceeds to block 206 where the transmitter determines the reflected energy. The reflected energy is the RF carrier energy received by the antenna when the transmitter is transmitting the RF carrier. Reflected energy results from impedance mismatches between the antenna impedance and its load impedance. As briefly discussed with reference to block 200, the antenna is typically designed such that its input impedance substantially matches the output impedance of the power amplifier and its output impedance matches the impedance of free space. Therefore, when the antenna is brought near an object, such as a metal wall, the load presented to it deviates from the desired free space impedance and an amount of energy is reflected into the antenna proportional to the amount of deviation the antenna's load impedance presents relative to free space. Similarly, as is known, the reflected energy received by the antenna enters the output of the power amplifier, thereby effectively varying its load, i.e. the antenna's input impedance. Thus, the load impedance presented to the power amplifier by the antenna is a function of objects within proximity of the antenna and is determinable by the level of power reflected from the antenna.

The reflected energy determination may be achieved by selecting either one of the two paths available at block 206. When the first path is chosen, the logic flow proceeds to block 208 where the transmitter samples the reflected energy and produces a scalar, or magnitude, representation of the reflected energy. The forward and reflected RF carrier signals present at the antenna input are sampled via a directional coupler or other device capable of differentiating the directional nature of these quantities. As discussed with reference to FIG. 1, the forward and reflected signal samples are rectified and filtered to produce DC voltages proportional to their respective magnitudes. The ratio of the reflected signal sample magnitude to the forward signal sample magnitude provides the scalar representation of the reflected energy and is known as the magnitude of the load reflection coefficient. Thus, the maximum value of this ratio is one, which corresponds to all the forward energy being reflected.

When the second path at block 206 is selected, the logic flow progresses to block 209 where the transmitter samples the reflected energy and produces a vector representation of the reflected energy. The sampling performed in this block is similar to the sampling discussed with reference to block 208, except the forward and reflected signal samples are not simply rectified and filtered. The transmitter operates on the forward and reflected signal samples using known techniques to extrapolate the magnitude and phase quantities associated with the ratio of the reflected signal sample to the forward signal sample. This ratio forms the vector representation of the reflected energy and identifies the magnitude and phase of the load reflection coefficient.

The value of the load reflection coefficient indicates the degree to which the varying antenna load deviates from the nominal loading that produces optimal power amplifier performance. Generally, antenna loads which are most likely to cause transmitter instability are those associated with large reflection coefficients, i.e. those which produce load reflection coefficient magnitudes greater than one half. Similarly, these highly reflective loads usually degrade the linearity performance of the power amplifier and are likely to require source level adjustment in order to avoid adjacent channel splatter.

The choice to use either the scalar or vector representation is determined by the trade off between circuit complexity and obtainable level of transmitter performance under varying antenna load conditions. The distribution of possible antenna loads covers the complex impedance plane resulting in two-dimensional variables. Accordingly, the reflection coefficient is a two-dimensional variable, having both magnitude and phase information. The scalar representation of the reflected energy expresses the two-dimensional antenna load as a single dimensional quantity, ignoring load information contained by the phase term. Although the circuit complexity to produce such a reflection coefficient is reduced with respect to the vector representation, the scalar representation's inability to distinguish phase may result in sub-optimal adjustment of the loop gain and signal source levels. Conversely, knowledge of both magnitude and phase of the antenna load, as provided by the vector representation, may permit precise setting of loop gain and signal source levels in response to the varying load presented by the antenna. Providing for such precision typically requires greater circuit complexity.

Upon obtaining either the scalar or vector representation of the reflected energy, the logic flow continues from blocks 208 and 209 to blocks 210 and 211 where the transmitter adjusts the gain of the I and Q channels' variable gain stages and the signal source levels of the I and Q signals based on the determined reflected energy representation. Similar to the discussion presented with reference to blocks 205 and 212, the transmitter's reflected energy representer generates a gain control signal to adjust the variable gain stages and a scaling command to adjust the signal source. Depending on antenna load condition and transmitter linearity requirements, the transmitter may adjust both the variable gain stages and the signal source levels or may make only one of the two adjustments. Additionally, the extent of antenna load variation, as determined by the chosen reflected energy representation, may be utilized to influence the adjustments made to the variable gain stages and the signal source by the loop gain determiner in blocks 205 and 212. For large load reflection coefficient magnitudes, the gain settings for the variable gain stages and the scaling command values administered to the signal source may require reductions relative to their respective settings provided by the loop gain determiner.

Load reflection coefficient information obtained via the reflected energy's vector representation may be applied in digital format to the address lines of a read only memory's (ROM) look-up table, which is contained in the transmitters reflected energy representer. Resident in the ROM is a set of predetermined data that may be used to control both the variable gain stages and the signal source levels. The data written to the ROM is determined by a pretraining operation at the time of transmitter manufacture. This pretraining procedure operates the transmitter into a series of selected non-optimal loads. Under each load configuration, the loop gain and signal source levels may be adjusted to provide optimal transmitter performance within the constraints of stability and maximum permissible adjacent channel splatter. In lieu of the ROM table, the vector representation of the load reflection coefficient may be submitted to a microprocessor or digital signal processor (DSP) as an input to a mathematical equation. The microprocessor or DSP evaluates the mathematical equation and produces appropriate control quantities which set loop gain and signal source levels.

The present invention may be further understood by way of an example. Consider TDMA communications systems where subscriber units, such as mobile or portable radiotelephones, transmit digitized voice or data during preassigned slot times of TDMA time frames. In this particular example, six fifteen millisecond transmission slots comprise a ninety millisecond time frame. A particular subscriber's transmission will typically be assigned to at least one of the time slots per time frame while the transmission is in progress. The first one millisecond portion of each time slot in each frame is dedicated to transmission of the training sequence. The training sequence provides a means for adjusting the loop phase at the beginning of the transmission slot. Since the phase around the loop is initially unknown, the loop phase adjustment is made with the feedback loop open. In the present invention, this is accomplished by inactivating the baseband variable gain stages present in the feedback loop. Known techniques are then employed to alternately measure and adjust loop phase to produce the required feedback signal polarity required for negative feedback.

During the first portion of the training sequence when the baseband variable gain stages are inactivated and the loop phase has been substantially adjusted to the value necessary for negative feedback, the transmitter measures the signal voltages across the I channel's variable baseband stage. This measurement represents the feedback open loop gain, i.e. feedback loop gain minus the gain contribution of the variable baseband gain stage, and provides an indication of the change in power amplifier gain associated with the variable antenna load when an isolator is not utilized in the transmitter. Variations in power amplifier gain result in variations in feedback loop gain and impact the amount of linearity augmentation provided by the overall transmitter. When the transmitter detects changes in the open loop gain, it adjusts the gain of the variable baseband gain stages to compensate for the gain variation incurred by the power amplifier due to changes in the antenna's load.

The second portion of the training sequence is used to determine the maximum permissible data signal level which the signal source may supply. When the scalar representation of the reflected energy is utilized, this portion of the training sequence is also used as the test signal during which the magnitude of the load reflection coefficient is determined. Generally, the amount of gain reduction required in the variable baseband gain stages is proportional to the magnitude of the load reflection coefficient. For reflection coefficient magnitudes less than 0.15, the transmitter may make no adjustment to the variable baseband gain stages or the signal source. Alternatively, for reflection coefficient magnitudes in the 0.15 to 0.5 range, the transmitter may reduce the gain of the variable baseband gain stages.

Reductions in the gains of the variable baseband gain stages are typically necessary to prevent unstable operation of the feedback loop due to mismatched loads present at the antenna. Antenna loads which are highly reactive or resonant near the frequency of operation may consume the feedback loop phase margin, resulting in feedback loop instability. When a significant reflection coefficient magnitude is measured, the present invention initiates a reduction of the signal source level in addition to the gain reduction of the baseband variable gain stages. Thus, the resulting signal source level is below the maximum permissible level determined during the second portion of the training sequence. The signal source level reduction allows the power amplifier linearity to be maintained, thus inhibiting the occurrence of adjacent channel splatter due to the varying antenna load.

When the vector representation of the reflected energy is incorporated into this example, the determination of the open loop gain performed during the first portion of the training sequence may be unnecessary. Rather, adjustments to the variable baseband gain stages and the signal source are directly determined from data stored in the transmitters ROM, or supplied via DSP calculation.

At the conclusion of the one millisecond training sequence period, the remaining fourteen milliseconds of the slot is used for the transmission of user data or digitized voice information. The training process may be repeated as often as every slot in order to allow the transmitter to track the effects of the time varying antenna load on loop gain and linearity.

The present invention provides a method for a transmitter to compensate for the effects of varying antenna loading without utilization of an isolator. With this method, the isolator is not required between the transmitter's amplifying element, or power amplifier, and its antenna to insure optimal transmitter performance. Moreover, the method of the present invention permits elimination of the isolator, thus enabling the transmitter to occupy less volume, cost less, weigh less, and be less band limited than with the isolator, while still maintaining desired transmitter functionality.

We claim:

1. A method for a transmitter to compensate for varying loading without utilization of an isolator, wherein the transmitter includes closed loop feedback, at least one linear amplifying element, an antenna, and at least one gain stage, wherein the closed loop feedback substantially maintains linear operation of the at least one amplifying element, the method comprises the steps of:
   a) determining, by the transmitter, effects of the varying loading on overall loop gain of the transmitter to determine overall loop gain changes; and
   b) adjusting, by the transmitter, gain of the at least one gain stage based on the overall loop gain changes to substantially maintain the overall loop gain at a predetermined gain level.

2. In the method of claim 1, the determination of the overall loop gain changes of step (a) comprises:
   a1) temporarily deactivating the at least one gain stage; and
   a2) determining the effects of the varying loading on the overall loop gain less the gain of the at least one gain stage to produce open loop gain changes.

3. In the method of claim 2, step (b) further comprises adjusting the gain of the at least one gain stage based on the open loop gain changes to substantially maintain the overall loop gain at the predetermined gain level.

4. In the method of claim 1, the determination of the effects of the varying loading further comprises determining reflected energy received by the antenna.

5. In the method of claim 4, step (b) further comprises determining a representation of the reflected energy and adjusting the gain of the at least one gain stage based on the representation of the reflected energy and the overall loop gain changes to substantially maintain the overall loop gain at the predetermined gain level, wherein the representation of the reflected energy includes a magnitude portion.

6. In the method of claim 4, step (b) further comprises determining a vector representation of the reflected energy and adjusting the gain of the at least one gain stage based on the vector representation of the reflected energy to substantially maintain the overall loop gain at the predetermined gain level, wherein the vector representation of the reflected energy includes a magnitude portion and a phase portion.

7. A method for a transmitter to compensate for varying loading without utilization of an isolator, wherein the transmitter includes closed loop feedback, at least one linear amplifying element, an antenna, a signal source, and at least one gain stage, wherein the closed loop feedback substantially maintains linear operation of the at least one amplifying element, wherein the signal source provides signals to the at least one linear amplifying element for amplification, and wherein the varying loading substantially occurs as a result of reflected energy being received by the antenna, the method comprises the steps of;

a) determining, by the transmitter, a representation of the reflected energy b) adjusting, by the transmitter, signal source level of the signals provided by the signal source to the at least one amplifying element based on the representation of the reflected energy;

the method further comprises the steps of:

c) determining, by the transmitter, effects of the varying loading on overall loop gain of the transmitter to determine overall loop gain changes;

d) adjusting, by the transmitter, the gain of the at least one gain stage based on the representation of the of the reflected energy and the overall loop gain changes to substantially maintain the overall loop gain at a predetermined gain level.

8. In the method of claim 7, step (d) further comprises adjusting the gain of the at least one gain stage based on a vector representation of the reflected energy to substantially maintain the overall loop gain at the predetermined gain level, wherein the vector representation of the reflected energy includes a magnitude portion and a phase portion.

* * * * *